United States Patent
Lin

(10) Patent No.: US 9,130,535 B2
(45) Date of Patent: Sep. 8, 2015

(54) DRIVER AMPLIFIER WITH ASYMMETRICAL T-COIL MATCHING NETWORK

(71) Applicant: QUALCOMM Incorporated, San Diego, CA (US)

(72) Inventor: Saihua Lin, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 115 days.

(21) Appl. No.: 13/722,433

(22) Filed: Dec. 20, 2012

(65) Prior Publication Data

US 2014/0176242 A1    Jun. 26, 2014

(51) Int. Cl.
| H03F 3/191 | (2006.01) |
| H03F 1/00 | (2006.01) |
| H03H 7/38 | (2006.01) |
| H03F 3/193 | (2006.01) |
| H03F 1/56 | (2006.01) |
| H03F 1/22 | (2006.01) |

(52) U.S. Cl.
CPC .............. *H03H 7/38* (2013.01); *H03F 1/223* (2013.01); *H03F 1/565* (2013.01); *H03F 3/191* (2013.01); *H03F 3/193* (2013.01); *H03F 2200/378* (2013.01)

(58) Field of Classification Search
USPC ......................................... 330/302, 195, 197
IPC ................................................ H03F 3/191,1/00
See application file for complete search history.

(56) References Cited

U.S. PATENT DOCUMENTS

| 3,413,563 | A | | 11/1968 | Tongue |
| 5,907,236 | A | * | 5/1999 | James ........................... 323/255 |
| 6,397,090 | B1 | | 5/2002 | Cho |
| 6,681,101 | B1 | | 1/2004 | Eidson et al. |
| 6,806,768 | B2 | | 10/2004 | Klaren et al. |
| 7,170,349 | B2 | | 1/2007 | Bhattacharjee et al. |
| 7,248,035 | B2 | * | 7/2007 | Babcock et al. ........... 324/750.3 |
| 7,385,445 | B2 | | 6/2008 | Wright |
| 7,630,693 | B2 | | 12/2009 | Liu et al. |
| 7,894,173 | B2 | * | 2/2011 | Deng et al. ...................... 361/56 |
| 8,072,272 | B2 | | 12/2011 | Zhao et al. |
| 8,181,140 | B2 | | 5/2012 | Kireev et al. |

(Continued)

FOREIGN PATENT DOCUMENTS

| EP | 0975089 A2 | 1/2000 |
| EP | 2131492 A1 | 12/2009 |

(Continued)

OTHER PUBLICATIONS

International Search Report and Written Opinion—PCT/US2013/076756—ISA/EPO—Jul. 4, 2014.

(Continued)

*Primary Examiner* — Patricia T Nguyen
(74) *Attorney, Agent, or Firm* — Ramin Mobarhan

(57) ABSTRACT

A driver amplifier with asymmetrical T-coil matching network is disclosed. In an exemplary embodiment, an apparatus includes a first inductor configured to receive an input signal at an input terminal and to provide an output signal at an output terminal that is matched to a resistive load. The apparatus also includes a second inductor connected to the first inductor and coupled to the first inductor by a coupling coefficient, the second inductor having a first terminal connected to a supply voltage.

19 Claims, 4 Drawing Sheets

(56) References Cited

U.S. PATENT DOCUMENTS

| | | | |
|---|---|---|---|
| 8,395,234 B2* | 3/2013 | Okushima et al. | 257/531 |
| 8,587,348 B2* | 11/2013 | Pelteshki et al. | 327/110 |
| 8,593,207 B2* | 11/2013 | Liu et al. | 327/360 |
| 8,848,810 B2 | 9/2014 | Lee et al. | |
| 2003/0222709 A1 | 12/2003 | Kim | |
| 2009/0039916 A1* | 2/2009 | Buchmann et al. | 326/38 |
| 2009/0085666 A1 | 4/2009 | Ohnishi et al. | |
| 2010/0026393 A1 | 2/2010 | Keerti et al. | |
| 2010/0225400 A1 | 9/2010 | Rofougaran et al. | |
| 2010/0291888 A1 | 11/2010 | Hadjichristos et al. | |
| 2010/0295629 A1 | 11/2010 | Klemens et al. | |
| 2010/0321110 A1 | 12/2010 | Ichitsubo et al. | |
| 2011/0037516 A1 | 2/2011 | Nejati et al. | |
| 2011/0037519 A1 | 2/2011 | Pletcher et al. | |
| 2011/0049672 A1 | 3/2011 | Okushima et al. | |
| 2011/0115565 A1 | 5/2011 | Cabanillas | |
| 2011/0201391 A1 | 8/2011 | Mankaruse et al. | |
| 2013/0190036 A1 | 7/2013 | Zhao et al. | |

FOREIGN PATENT DOCUMENTS

| | | |
|---|---|---|
| JP | 2002217660 A | 8/2002 |
| JP | 2004007405 A | 1/2004 |
| KR | 20080005283 A | 1/2008 |
| KR | 20110031432 A | 3/2011 |
| WO | 0122604 | 3/2001 |
| WO | 2009111208 | 9/2009 |

OTHER PUBLICATIONS

Shekhar S., et al., "Bandwidth Extension Techniques for CMOS Amplifiers," IEEE Journal of Solid-State Circuits, IEEE Service Center, Piscataway, NJ, USA, vol. 41 (11), Nov. 1, 2006, pp. 2424-2439, XP011149841, ISSN: 0018-9200, DOI: 10.1109/JSSC.2006.883336, the whole document.

Vaithianathan V., et al., "Active Inductor based Low Noise Amplifier for Ultra Wide Band Receiver," International Journal of Computer Applications, vol. 41 (5), Mar. 31, 2012, pp. 53-60, XP055108263, DOI: 10.5120/5621-7913, p. 55, figures 5, 6, 7.

\* cited by examiner

DRIVER AMPLIFIER WITH ASYMMETRICAL T-COIL MATCHING NETWORK

BACKGROUND

1. Field

The present application relates generally to the operation and design of analog front ends, and more particularly, to the operation and design of driver amplifiers and matching networks for use in analog front ends.

2. Background

Wireless devices have become increasing more complex resulting in more circuitry being incorporated onto smaller chips and circuit boards. For example, a power amplifier may be incorporated onto a transmitter chip to save space. However, incorporating the power amplifier on the chip may not be feasible due to size or power constraints. In such cases, a small area, low power, and highly linear driver amplifier is needed. The driver amplifier should include a matching network to correctly match its output to an external power amplifier.

Accordingly, what is needed is a small area, low power, and highly linear driver amplifier and matching network with reduced space requirements for use in wireless devices.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
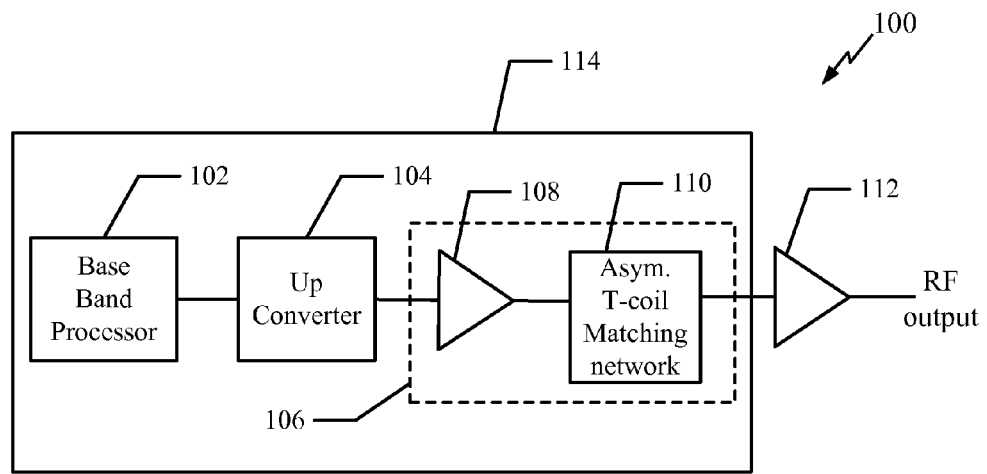
FIG. 1 shows a transmitter that includes an exemplary embodiment of a driver amplifier with asymmetrical T-coil matching network.

FIG. 1 shows a transmitter 100 that includes an exemplary embodiment of a driver amplifier with asymmetrical T-coil matching network 106. The transmitter 100 includes a transmitter module 114 (or integrated circuit) that comprises a baseband processor 102 that outputs baseband data to be transmitted to an up-converter 104. The up-converter 104 up-converts the baseband signal to an RF signal and inputs this RF signal to the driver amplifier 106. The driver amplifier 106 comprises a driver amplifier core 108 and an asymmetrical T-coil matching network 110. The matching network 110 is configured to provide the optimal impedance that the driver amplifier 106 wants to see with the presence of an external amplifier 112. In various exemplary embodiments, the driver amplifier with asymmetrical T-coil matching network 106 uses less circuit area than conventional matching circuits to provide wideband operation, reduced component count, small footprint, and robust operation that is not sensitive to process, variation or temperature (PVT).

Figure 2:
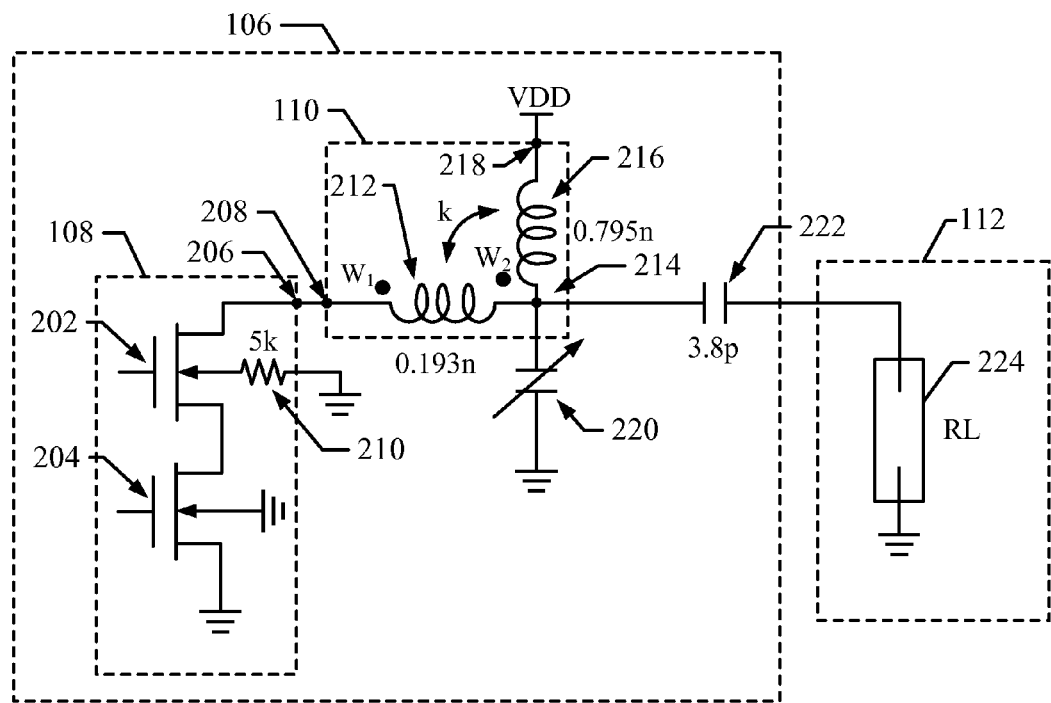
FIG. 2 shows a detailed exemplary embodiment of the driver amplifier with asymmetrical T-coil matching network illustrated in FIG. 1.

FIG. 2 shows a detailed exemplary embodiment of the driver amplifier with asymmetrical matching network 106 illustrated in FIG. 1. In an exemplary embodiment, the driver amplifier core 108 comprises cascode transistors 202, 204 having a first source terminal 206 connected to a first tap 208 of the asymmetrical T-coil 110. The body of the cascode transistor 202 is connected to a resistor 210 that is connected to ground to increase the gain and improve the linearity of the driver amplifier core 108.

In various exemplary embodiments, the three terminal asymmetrical T-coil 110 comprises a first inductor portion 212 connected between the first tap 208 and a second tap 214, and a second inductor portion 216 connected between the second tap 214 and a third tap 218. For example, the first inductor portion 212 has an inductance value that is different from the second inductor portion 216. In an exemplary embodiment, the asymmetrical T-coil 110 is formed from a single inductor having the above identified taps and/or terminals. In another exemplary embodiment, the asymmetrical T-coil 110 is formed from two inductors connected together at the second tap 214 and coupled together by a coupling coefficient (k) to form a three terminal device. For example, the two coils can be implemented in aluminum or other metal or suitable material.

The inductor portions 212, 216 are coupled by a coupling coefficient k that can be positive or negative (a positive k may be easier to implement). For example, the inductor winding indicators $W_1, W_2$ indicate winding directions that will result in a positive coupling coefficient. By changing the direction of the inductor windings, it is possible to obtain a negative coupling coefficient. Coupling of the inductors (212, 216) helps to reduce the inductor values and increase Q. The second inductor portion 216 is connected to a VDD supply at the third tap 210. In an exemplary embodiment, the VDD supply can also be implemented as an AC ground. The sizes of the inductances of the T-coil 110 are chosen according to the desired matching impedance. For example, in an exemplary embodiment, the inductor portion 212 has an inductor value of 0.192 nanohenries and the inductor portion 216 has a value of 0.795 nanohenries and the coupling coefficient k equals (0.47).

A tunable capacitor bank 220 is connected between the second tap 214 and ground and is tunable to achieve constant gain and error vector magnitude (EVM) (e.g. linearity) across frequency bands. A capacitor 222 is connected between the second tap 214 and a resistive load 224. In an exemplary embodiment, the load 224 represents an impedance associated with the external amplifier 112. For example, the resistive load comprises the real part of the impedance.

By utilizing the asymmetrical T-coil 110, the driver amplifier core 108 and matching network 110 can be implemented in an area that is smaller than previous designs because fewer components are utilized. Furthermore, the driver amplifier core 108 utilizes approximately 50% less power than previous designs. In exemplary embodiments, the driver amplifier core with asymmetrical T-coil matching network 106 provides a small area low power driver amplifier design for the 5 GHz band. The techniques can also be applied to obtain a small area low power driver amplifier design for the 2 GHz band or other frequency bands.

T-Coil Design

In various exemplary embodiments, a variety of matching circuits can be converted into an asymmetrical T-coil matching network implementation as illustrated below.

Figure 3:
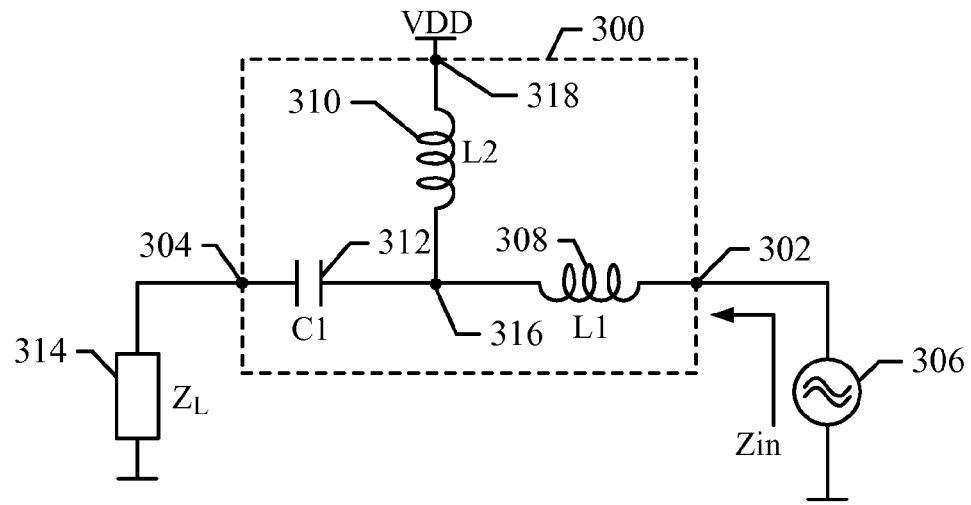
FIG. 3 shows a matching network to be converted into a T-coil matching network to achieve smaller circuit size.

FIG. 3 shows a matching circuit 300 to be converted into an asymmetrical T-coil matching network configuration to achieve smaller circuit size. The matching circuit 300 comprises a first terminal 302, a second terminal 304 and a third terminal 318. A source 306 connects to the first terminal 302 and sees an input impedance of Zin at the first terminal 302. For example, in an exemplary embodiment, the source 306 represents a transistor drain of a driver amplifier core, such as the driver amplifier core 108 shown in FIG. 1. The second terminal 304 is connected to a load that has an impedance value designated as $Z_L$.

The matching circuit 300 comprises a first inductor (L1) 308 connected between the first terminal 302 and a node 316. A capacitor (C1) is connected between the node 316 and the second terminal 304. A second inductor (L2) is connected between the node 316 and the terminal 318, which is further connected to VDD (or AC ground). The matching circuit 300 can be converter to an asymmetrical T-coil matching network implementation according to the following operations described below. The asymmetrical T-coil matching network will reduce the number of components and therefore reduce the required circuit area.

Figure 4:
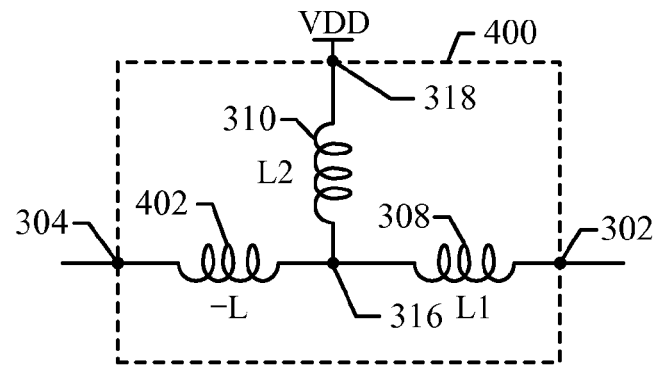
FIG. 4 shows an exemplary embodiment of an inductor equivalent matching network that is converted from the matching network shown in FIG. 3 after a first conversion operation.

FIG. 4 shows an exemplary embodiment of a matching circuit 400 which represent the matching circuit 300 after a first conversion operation. For example, the matching circuit 300 having two inductors and a capacitor is converted to the matching circuit 400 having three inductors. The matching circuit 400 comprises the first inductor L1 308 and the second inductor L2 310. The capacitor C1 312 is converted to an inductor 402 have an inductance value of (−L). For example, the following expressions can be used to convert the capacitance C1 312 to the inductor 402 at the desired operating frequency.

$$\frac{1}{j\omega C} = -j\omega L \quad (1)$$

$$-L = -\frac{1}{C\omega^2} \quad (2)$$

Figure 5:
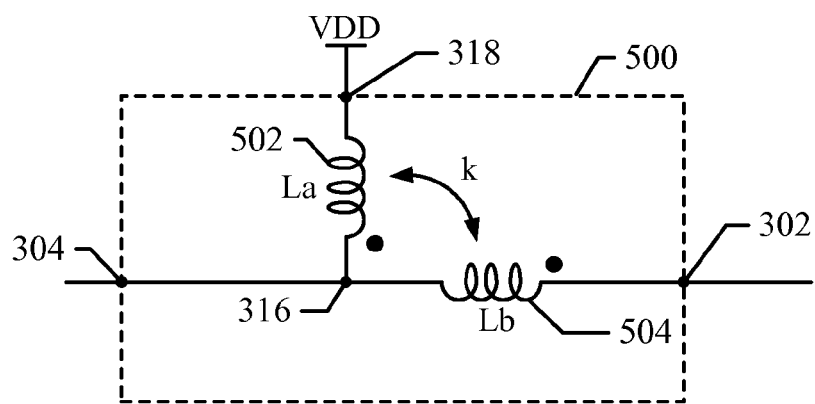
FIG. 5 shows an exemplary embodiment of an asymmetrical T-coil matching network that is converted from the inductor equivalent matching network shown in FIG. 4 after a second conversion operation.

FIG. 5 shows an exemplary embodiment of a matching circuit 500 which represent the matching circuit 400 after a second conversion operation. For example, the matching circuit 400 with the three inductors (308, 310, and 402) is converted to the asymmetrical T-coil matching circuit 500 having an asymmetrical T-coil configuration. The asymmetrical T-coil configuration comprises a first inductor portion 502 having an inductance value of (La) connected between the node 316 and the terminal 318. The asymmetrical T-coil also comprises a second inductor portion 504 having an inductance value of (Lb) coupled between the node 316 and the terminal 302. The second operation to determine the inductance values of the asymmetrical T-coil is performed according to the expressions below where k is the coupling coefficient.

$$L = k\sqrt{La \times Lb} \quad (3)$$

$$L1 = Lb + L \quad (4)$$

$$L2 = La + L \quad (5)$$

Therefore, by performing the above operations, the matching circuit 300 can be converted to the asymmetrical T-coil matching circuit 500. This allows the removal of the capacitor 312 from the matching circuit. As a result, the matching circuit 500 can be implemented in a smaller circuit area than the matching circuit 300. Accordingly, the above operations can be used to remove capacitors from any matching circuit thereby resulting in fewer components and reduced circuit area.

Figure 6:
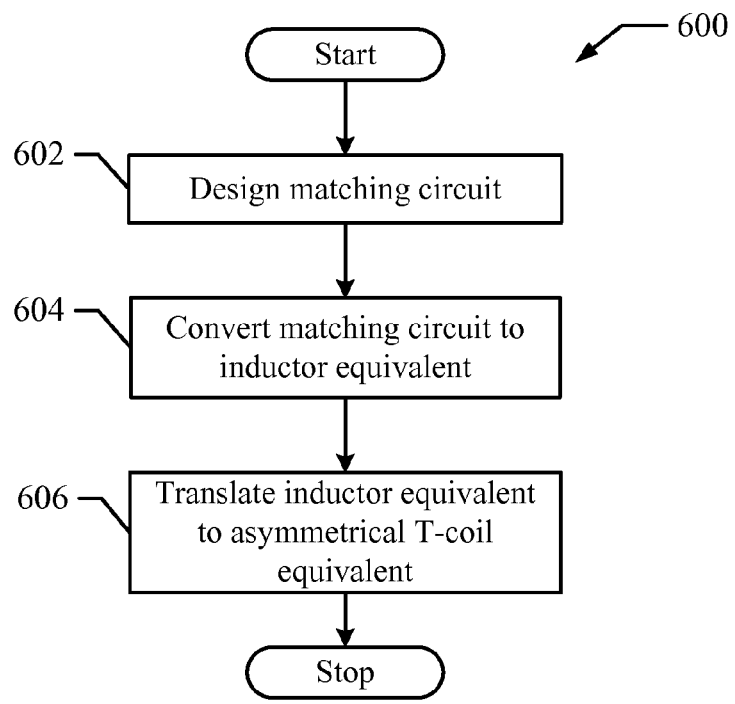
FIG. 6 shows an exemplary embodiment of a method for converting a matching network to an equivalent asymmetrical T-coil matching network.

FIG. 6 shows an exemplary embodiment of a method for converting a matching circuit to an equivalent asymmetrical T-coil matching circuit. For example, the method 600 can be used to convert the matching circuit 300 to the matching circuit 500.

At block 602, a matching circuit is designed to match a driver amplifier to an external load. For example, the matching circuit is designed to match the output of the driver amplifier core 108 to the input load of the external amplifier 112.

At block 604, the matching circuit is converted to an inductor equivalent matching circuit that comprises only inductors. For example, the above equations (1-2) with respect to FIG. 4 illustrate one example of converting a matching circuit to an inductor equivalent matching circuit. It should be noted that the conversion is not limited to using only the above equations and that the inductor equivalent can be obtained in other ways.

At block 606, the inductor equivalent matching circuit is translated to an asymmetrical T-coil equivalent matching circuit. For example, the above equations (3-5) illustrate one example of converting an inductor equivalent matching circuit to an asymmetrical T-coil equivalent matching circuit. It should be note that the conversion is not limited to using only the above equations and that the asymmetrical T-coil equivalent can be obtained in other ways.

According, the method 600 provides a mechanism to convert a matching circuit to an asymmetrical T-coil equivalent matching circuit to reduce circuit area. It should be noted that the operations of the method 600 can be rearranged, modified or changed by one with skill in the art such that other equivalent methods are possible.

Figure 7:
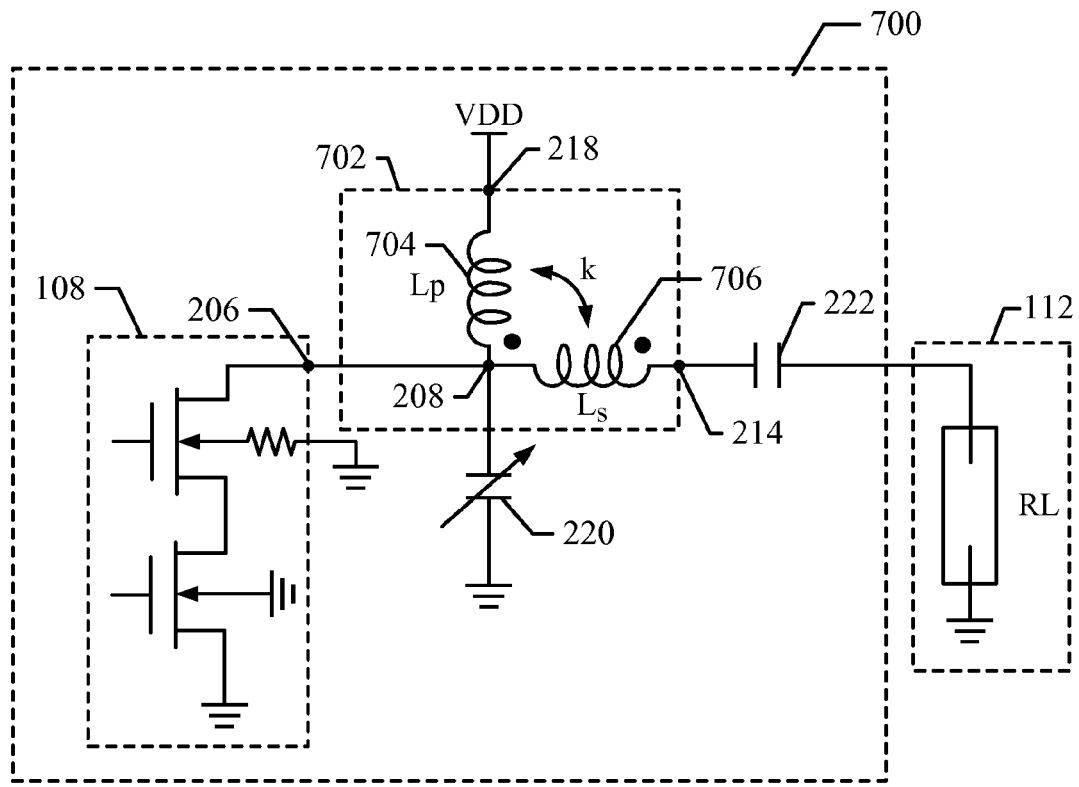
FIG. 7 shows an alternative exemplary embodiment of a driver amplifier with asymmetrical T-coil matching network.

FIG. 7 shows an alternative exemplary embodiment of a driver amplifier 700 with asymmetrical T-coil matching network 702. For example, the driver amplifier 700 is an alternative embodiment to the driver amplifier 106 illustrated in FIG. 2. In an exemplary embodiment, the driver amplifier 700 comprises the three terminal asymmetrical T-coil 702 having first inductor portion 706 connected between the first tap 208 and the second tap 214, and a second inductor portion 704 connected between the first tap 208 and the third tap 218. In an exemplary embodiment, the asymmetrical T-coil 702 is formed from a single inductor having a middle tap, such as the first tap 208. In another embodiment, the T-coil 704 is formed from two inductors connected together at the first tap 208 to form a three terminal device. The inductor portions 704, 706 are coupled by a coupling coefficient (k) that can be positive or negative (a positive k is easier to implement). Coupling of the inductors (704, 706) helps to reduce the inductor values and increase Q. The inductor portion 704 is connected to the VDD supply at the tap 218. The sizes of the inductances of the T-coil 702 are chosen according to the desired matching impedance. For example, the sizes of the inductances of the T-coil 702 may be determined from the above equations as a translation from a desired matching network. The driver amplifier 700 also comprises AC coupling capacitor 222 and tunable capacitor 220.

Figure 8:
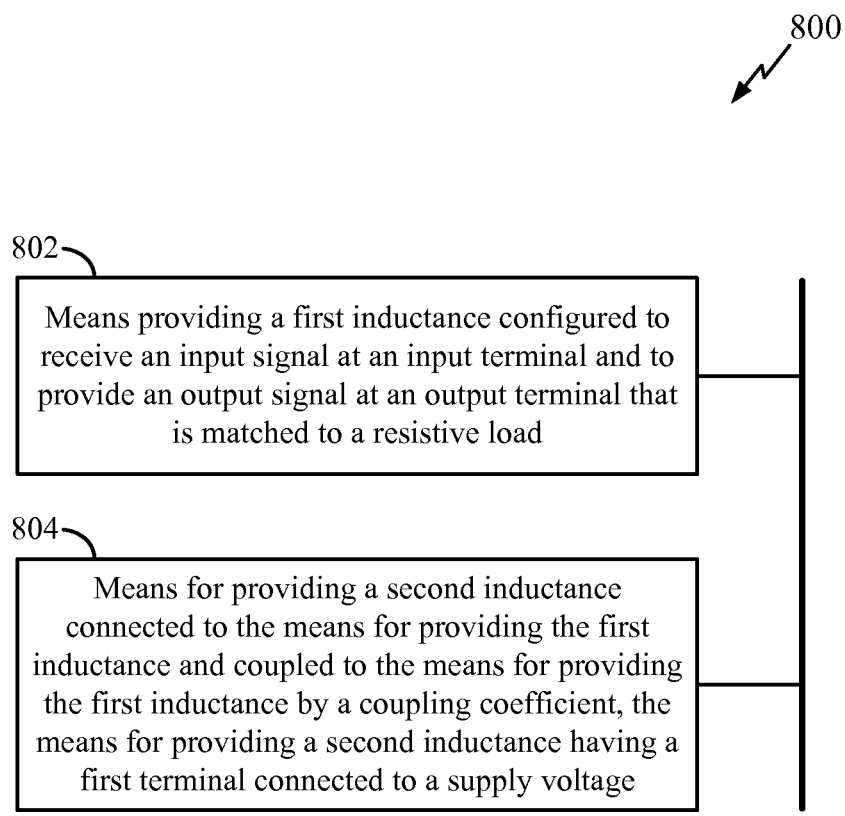
FIG. 8 shows an exemplary embodiment of a driver amplifier with asymmetrical T-coil matching network apparatus.

FIG. 8 shows an exemplary embodiment of a T-coil apparatus 800. For example, the apparatus 800 is suitable for use with the matching network 106 shown in FIG. 2. In an aspect, the apparatus 800 is implemented by one or more modules configured to provide the functions as described herein. For example, in an aspect, each module comprises hardware and/or hardware executing software.

The apparatus 800 comprises a first module comprising means (802) for providing a first inductance configured to receive an input signal at an input terminal and to provide an output signal at an output terminal that is matched to a resistive load, which in an aspect comprises the inductor portion 212.

The apparatus 800 comprises a second module comprising means (804) for providing a second inductance connected to the means for providing the first inductance and coupled to the means for providing the first inductance by a coupling coefficient, the means for providing a second inductance having a first terminal connected to a supply voltage, which in an aspect comprises the inductor portion 216.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus, comprising:
a first inductor configured to receive an input signal at an input terminal and to provide an output signal at an output terminal that is matched to a resistive load; and
a second inductor connected to the first inductor and coupled to the first inductor by a coupling coefficient, the second inductor having a first terminal directly connected to a supply voltage, the first inductor and the second inductor configured to have winding configurations generating the coupling coefficient, and the input terminal configured to receive the input signal from an amplifier.

2. The apparatus of claim 1, the second inductor connected to the first inductor at the input terminal.

3. The apparatus of claim 2, the first inductor and the second inductor having different inductance values.

4. The apparatus of claim 2, the first inductor and the second inductor forming an asymmetric T-coil.

5. The apparatus of claim 2, the first inductor and the second inductor configured to have the winding configurations so that the coupling coefficient has a positive or a negative value.

6. The apparatus of claim 1, the amplifier comprising a driver amplifier core.

7. The apparatus of claim 1, the resistive load is determined from an amplifier input.

8. The apparatus of claim 1, the second inductor connected to the first inductor at the output terminal.

9. The apparatus of claim 8, the first inductor and the second inductor having different inductance values.

10. The apparatus of claim 8, the first inductor and the second inductor forming an asymmetric T-coil.

11. The apparatus of claim 8, the first inductor and the second inductor configured to have the winding configurations so that the coupling coefficient has a positive or a negative value.

12. The apparatus of claim 8, the input terminal configured to receive the input signal from an amplifier.

13. The apparatus of claim 12, the amplifier comprising a driver amplifier core.

14. The apparatus of claim 8, the resistive load is determined from an amplifier input.

15. An apparatus, comprising:
means for providing a first inductance configured to receive an input signal at an input terminal and to provide an output signal at an output terminal that is matched to a resistive load; and
means for providing a second inductance connected to the means for providing the first inductance and coupled to the means for providing the first inductance by a coupling coefficient, the means for providing a second inductance having a first terminal directly connected to a supply voltage, the means for providing the first inductance and the means for providing the second inductance configured to have winding configurations generating the coupling coefficient, and the input terminal configured to receive the input signal from an amplifier.

16. The apparatus of claim 15, the mean for providing a second inductance connected to the means for providing a first inductance at the input terminal.

17. The apparatus of claim 15, the means for providing a first inductance and the means for providing a second inductance forming an asymmetric T-coil.

18. The apparatus of claim 15, the mean for providing a second inductance connected to the means for providing a first inductance at the output terminal.

19. A method, comprising:
configuring a matching circuit to match an amplifier to a resistive load;
performing a first conversion to convert the matching circuit to an inductor equivalent circuit; and
performing a second conversion to convert the inductor equivalent circuit to an asymmetric T-coil comprising first and second inductor portions coupled together by a coupling coefficient, the first inductor portion configured to receive an input signal and having an input terminal connected to the amplifier and an output terminal connected to the resistive load, the second inductor portion connected to the first inductor portion and includes a first terminal directly connected to a supply voltage, the first inductor portion and the second inductor portion configured to have winding configurations generating the coupling coefficient, and the input terminal configured to receive the input signal from the amplifier.

* * * * *